(12) United States Patent  
Storaska et al.

(10) Patent No.: US 7,514,301 B2
(45) Date of Patent: Apr. 7, 2009

(54) METHOD FOR FABRICATING NANOCOILS

(75) Inventors: Garrett A. Storaska, Reston, VA (US); Robert S. Howell, Wheaton, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 77 days.

(21) Appl. No.: 11/524,246

(22) Filed: Sep. 21, 2006

(65) Prior Publication Data

US 2009/0053860 A1 Feb. 26, 2009

Related U.S. Application Data

(60) Provisional application No. 60/719,590, filed on Sep. 23, 2005.

(51) Int. Cl.
*H01L 21/00* (2006.01)
*H01L 21/84* (2006.01)
(52) U.S. Cl. ...................................... 438/149
(58) Field of Classification Search ............ 438/57, 438/149; 365/63
See application file for complete search history.

(56) References Cited

U.S. PATENT DOCUMENTS

2002/0086456 A1* 7/2002 Cunningham et al. ......... 438/57
2005/0013151 A1* 1/2005 Nathanson et al. ........... 365/63

* cited by examiner

*Primary Examiner*—Davienne Monbleau
*Assistant Examiner*—Monica D Harrison
(74) *Attorney, Agent, or Firm*—Andrews Kurth LLP

(57) ABSTRACT

A method for fabricating nanocoils and improved nanocoils fabricated therefrom. Embodiments of the method utilizing deep reactive ion etching (DRIE). A method for fabricating nanocoils includes providing a silicon-on-insulator (SOI) wafer, in which SOI wafer includes buried oxide layer, patterning one or more devices into a layer of silicon on top of the buried oxide layer, depositing tensile stressed nitride layer on the top silicon layer, patterning coiling arm structure on top silicon layer, patterning an overlapping etch window mask on bottom side of SOI wafer using, in which patterning overlapping etch window mask removes SOI wafer and exposes buried oxide layer in width greater than coiling arm structure, and releasing coiling arm structure so that coiling arm coils to form nanocoil. In embodiments, DRIE is utilized to pattern the overlapping etch window mask.

14 Claims, 5 Drawing Sheets

METHOD FOR FABRICATING NANOCOILS

CROSS-REFERENCE TO RELATED APPLICATIONS

This application claims the priority of U.S. Provisional application No. 60/719,590, entitled "Microscopic Electro-Mechanical Systems, Radio Frequency Devices Utilizing Nanocoils and Spiral Pitch Control Techniques For The Same," filed Sep. 23, 2005, which is hereby incorporated by reference in its entirety. This application is also related to U.S. patent application Ser. No. 11/524,245, entitled "Microscopic Electro-Mechanical Systems, Radio Frequency Devices Utilizing Nanocoils and Spiral Pitch Control Techniques For Fabricating The Same," filed herewith on Sep. 21, 2006 and U.S. patent application, Ser. No. 11/524,246, entitled "Improved Nanocoils, Systems and Methods For Fabricating Nanocoils," filed herewith on Sep. 21, 2006, both of which are hereby incorporated by reference in their entirety.

BACKGROUND

Nanocoils are coiled circuits, including memory devices and other circuits. Nanocoils have great potential for superdense memory and power FET applications due to nanocoils' enormous surface storage and periphery area to volume ratio. Previously, a 100× improvement over planar memory has been experimentally realized by using stress ridges to force concentric coiling on polycrystalline silicon (Si) nanocoil. A typical Si nanocoil may be fabricated from silicon nitride/silicon ($Si_3Ni_4$/Si). The nitride is a stressed nitride that provides coiling stress cause the formation of the nanocoils when released from an underlying substrate. Such a nanocoil is capable of 100× greater volume density than conventional ICs.

A standard fabrication technique of polycrystalline Si nanocoils involves reactive ion etching (RIE) through coiling layers to expose an oxide release layer and then dipping in hydrofluoric (HF) acid to dissolve the oxide release layer (RIE is a variation of plasma etching in which during etching, semiconductor wafer being etched is placed on a RF powered electrode. The semiconductor wafer takes on potential which accelerates etching species extracted from plasma toward the etched surface. Chemical etching reaction is preferentially taking place in the direction normal to the surface, i.e., etching is more anisotropic than in plasma etching but is less selective). Such a technique is referred to as a "wet" etch technique because of the use of HF acid dip. Attempts to apply this same wet etch technique to single crystalline Si nanocoils with a buried oxide layer (BOX) were unsatisfactory because a longer HF dip time was required, resulting in the dissolution of at least some of the stressed nitride layer to be dissolved. The dissolution of the stressed nitride layer reduced or eliminated the coiling stress, reducing the amount of coiling. Furthermore, such technique limited the nanocoil yield, typically to narrow sections of the silicon surface. The wet etch technique, therefore, is not compatible with standard high reliability fabrication techniques.

SUMMARY

An advantage of the embodiments described herein is that they overcome the disadvantages of the prior art. These advantages and others are also achieved by a method for fabricating nanocoils. Embodiments of the method for fabricating nanocoils includes providing a silicon-on-insulator (SOI) wafer, in which SOI wafer includes buried oxide layer, patterning one or more devices into a layer of silicon on top of the buried oxide layer, depositing tensile stressed nitride layer on the top silicon layer, patterning coiling arm structure on top silicon layer, patterning an overlapping etch window mask on bottom side of SOI wafer using, in which patterning overlapping etch window mask removes SOI wafer and exposes buried oxide layer in width greater than coiling arm structure, and releasing coiling arm structure so that coiling arm coils to form nanocoil. In embodiments, DRIE is utilized to pattern the overlapping etch window mask.

These advantages are also achieved by an improved nanocoil that includes a silicon device layer comprising one or more devices patterned on the silicon device layer, a nitride layer that provide coiling stress for nanocoil, and an oxide passivation layer located on bottom-side of silicon device layer.

DESCRIPTION OF THE DRAWINGS

The detailed description will refer to the following drawings, wherein like numerals refer to like elements, and wherein.

DETAILED DESCRIPTION

Methods of fabricating nanocoils are described herein. Embodiments utilize a dry etch technique and overcome the disadvantages of the wet etch techniques described above. The dry etch technique produces nanocoils with larger areas than the wet etch technique and is more reliable. Embodiments include deep reactive ion etching (DRIE). Embodiments enable a high reliability and high volume standard nanocoil memory device fabrication process. Embodiments also leave intact an under-layer of oxide which can act as good passivation for the bottom interface of the nanocoils silicon device/circuit layer.

Nanocoils have been previously described in U.S. patent application Ser. No. 10/861,885 ("the '885 application"), filed on Jun. 7, 2004 (published as US 2005/0013151), which is incorporated herein by reference in its entirety. The '885 application describes both nanocoils and methods of fabricating nanocoils. A method of fabricating nanocoils, such as in the '885 application, includes forming a desired circuit/device silicon layer, disposing optional insulator layers above and below the circuit layer, disposing a stressed coiling layer (typically nitride) beneath or above the circuit layer and disposing a buried, sacrificial (e.g., oxide) layer beneath all of the layers, all on a substrate, typically silicon. The sacrificial may be oxide, typical Silicon Oxide, or other sacrificial material. The circuit layer may be memory, control or other circuitry as desired. The layers formed form a coiling arm structure that when released will coil into the nanocoil. The sacrificial layer is selectively removed, typically with a wet hydro-flouric (HF) acid, releasing the layers, including the circuit layer, from the substrate so that the layers coil into a dense, coiled device, the nanocoil. A metallization layer (e.g., gold) may be applied to protect the stressed coiling layer before applying the HF acid.

Figure 1:
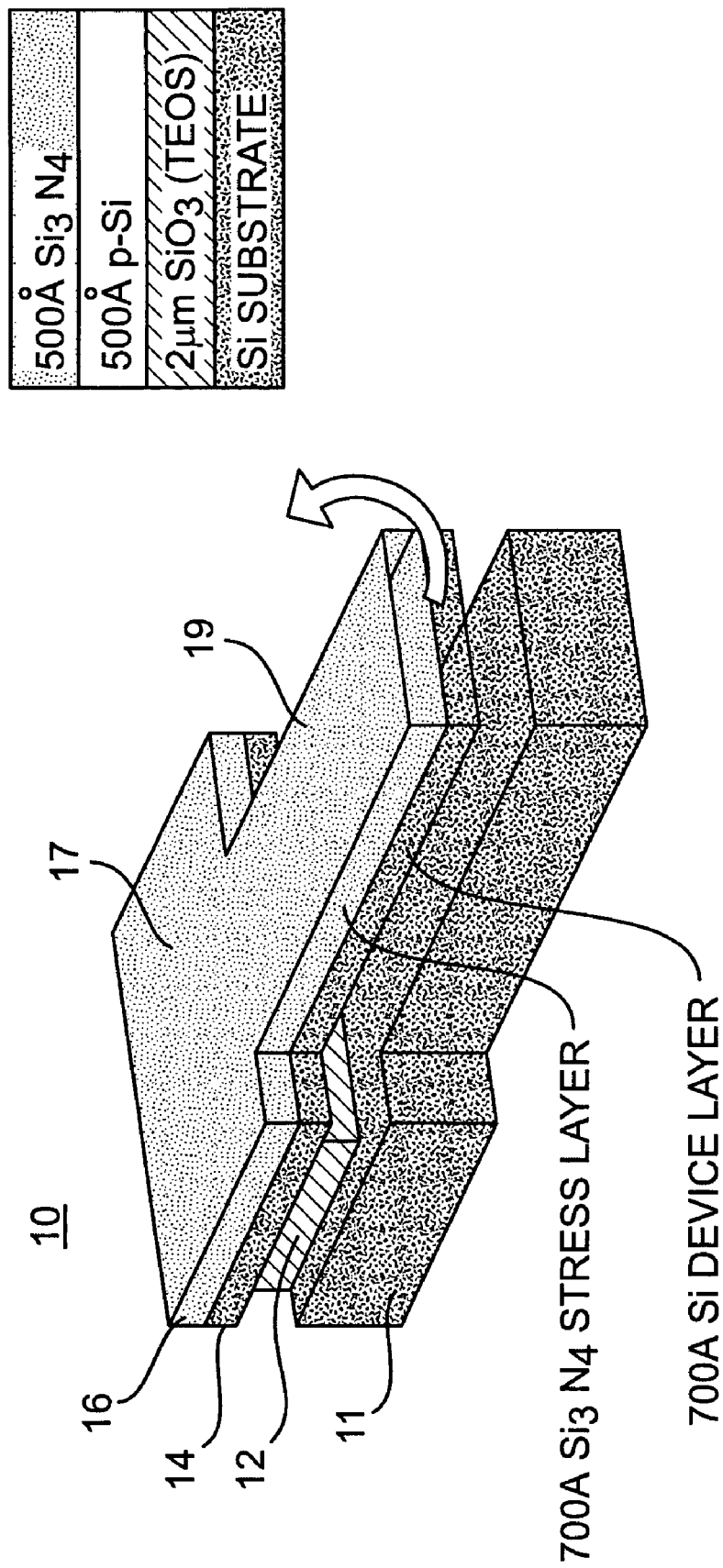
FIG. 1 is a block diagram illustrating a standard nanocoil fabrication technique.

With reference now to FIG. 1, shown is system 10, a combination of deposited and defined layers, for fabricating polycrystalline silicon (poly-si) nanocoils. The combination of layers 10 was created using a standard fabrication technique of poly-si nanocoils, which is described herein. The technique includes depositing a thick 2 μm TEOS oxide release layer 12 (TEOS is tetraethyl orthosilicate, $Si(OC_2H_5)_4$, a gaseous compound commonly used in chemical vapor deposition (CVD) of $SiO_2$ processes (resulting deposited $SiO_2$ is called "TEOS Oxide"); TEOS thermally decomposes at around 700° C. to form $SiO_2$, although plasma enhancement lowers temperature of deposition to below 500° C.) on a silicon substrate 11, followed by a coiling layers (actually, a bi-layer) composed of a compressively stressed poly-si device layer 14 (with devices/circuits patterned thereon) and a highly tensile stressed silicon nitride layer (the "stressed nitride layer") 16 (e.g., deposited by low pressure chemical vapor deposition (LPCVD)) of approximately 500 Å each. Deposition order of device layer 14 and stressed nitride layer 16 may be reversed. Patterning/definition of device layer 14 takes place before deposition of stressed nitride layer 16 (unless deposition order reversed). Next, a coiling arm structure with anchor pad 17 and coiling arm 19 (200-1000 μm long and 10 μm wide) is patterned by RIE etching through the coiling bi-layer (device layer 14 and stressed nitride layer 16) to expose the TEOS oxide release layer 12 in field regions between coiling arm structures (typically, many coiling arm structures are patterned on a substrate at a time). Then the layers are dipped in 49% HF acid for approximately one (1) minute to allow the oxide (in TEOS oxide release layer 12) to selectively undercut and dissolve the 10 μm wide coiling arm. After the oxide under the long, narrow coiling arm 19 is dissolved, the released arm 19 coils upward, forming a nanocoil, due to the bi-layer stress state inherent in the coiling bi-layer. Because of the RIE etching and HF acid dipping, this nanocoil fabrication technique is referred to as the "wet etch" technique.

To achieve single crystalline silicon coiling for CMOS memory devices, the wet etch technique was applied to an SOI wafer (a SOI wafer is a "silicon-on-insulator" wafer, a silicon wafer with a thin layer of oxide ($SiO_2$) buried in it; devices/circuits are built into a layer of silicon on top of the buried oxide; SOI substrates provide superior isolation between adjacent devices in an integrated circuit as compared to devices/circuits built into bulk wafers). SOI was chosen because it inherently contains an oxide layer and thin single crystalline silicon top layer. In the present example, a buried oxide layer (BOX) of 2000 Å and a top single crystalline silicon layer of 700 Å was utilized. A tensile stressed nitride layer of 700 Å was deposited directly to the top silicon layer and the coiling arm structure was patterned (by RIE etching to expose BOX) and dipped in HF acid. Unfortunately, this technique was unsuccessful because the BOX etch rate in the HF is far slower than that of the deposited TEOS oxide shown in FIG. 1. This necessitated long (e.g., 5 minute) HF acid dip times to release 10 μm wide coiling arms. These longer dip times limit the released coil width to narrow sections of the SOI wafer surface as well as slowly dissolve the stressed nitride layer, thereby eliminating coiling stress.

Figure 2A:
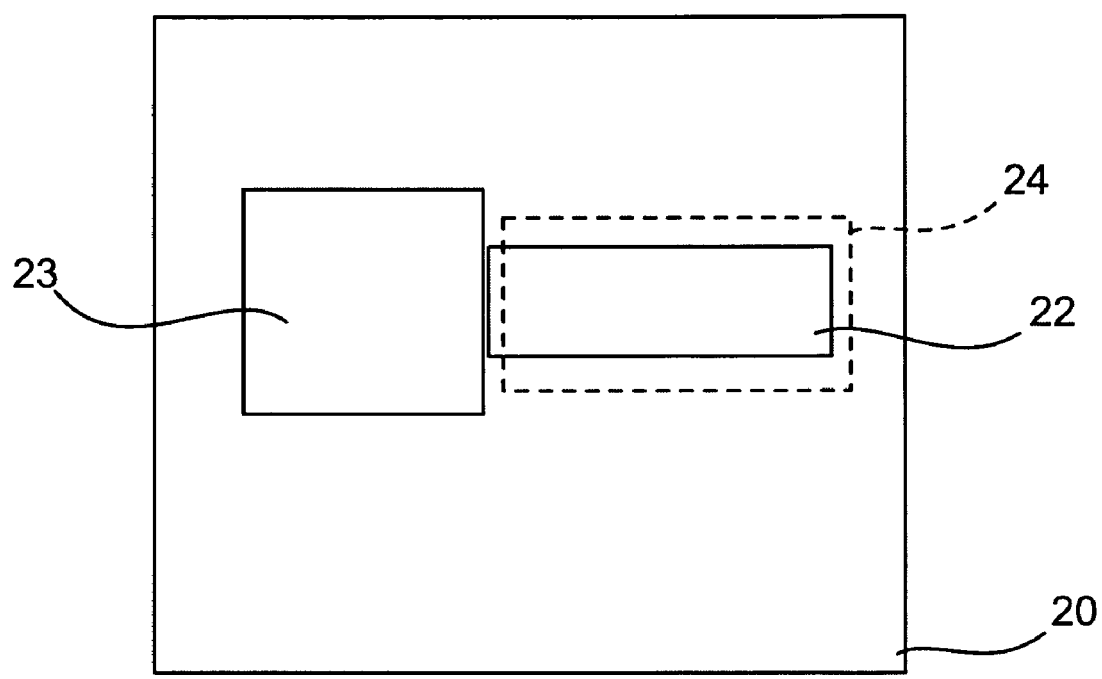
FIGS. 2A-2C are block diagrams illustrating an embodiment of a method for fabricating nanocoils utilizing a deep reactive ion etching technique.
Figure 2B:
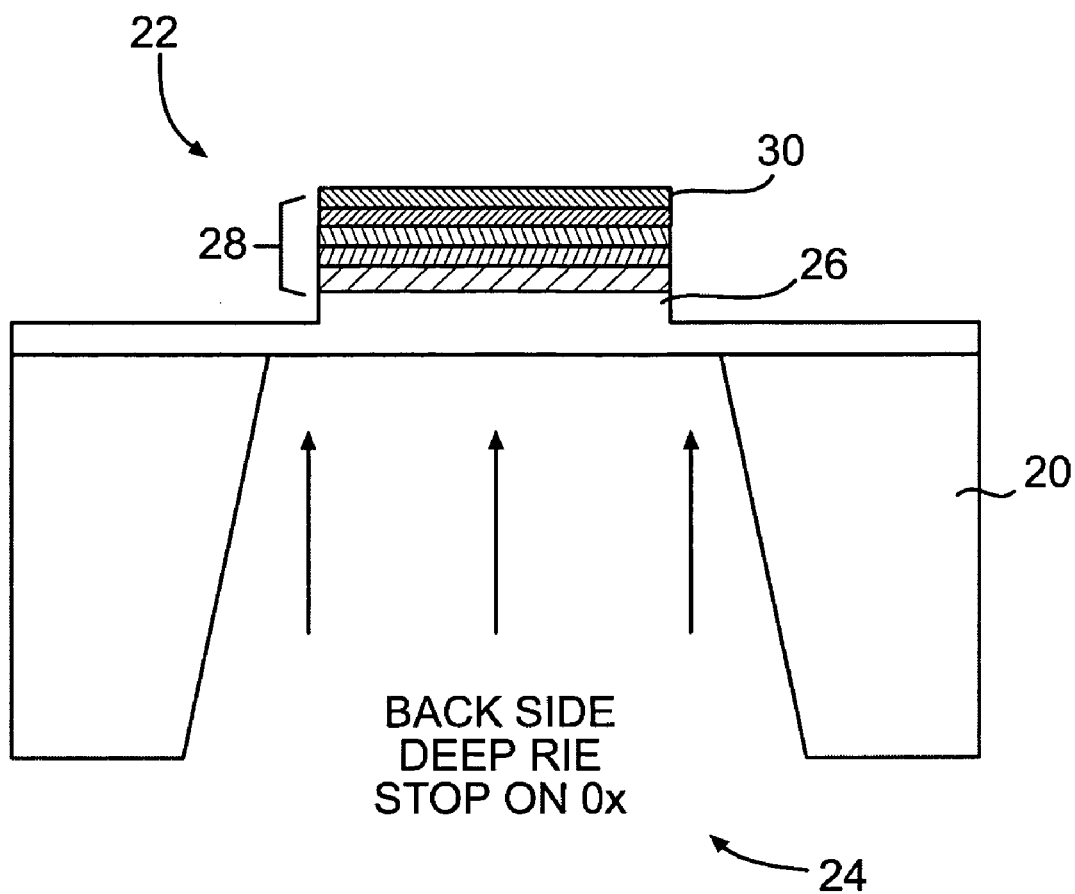
Figure 2C:
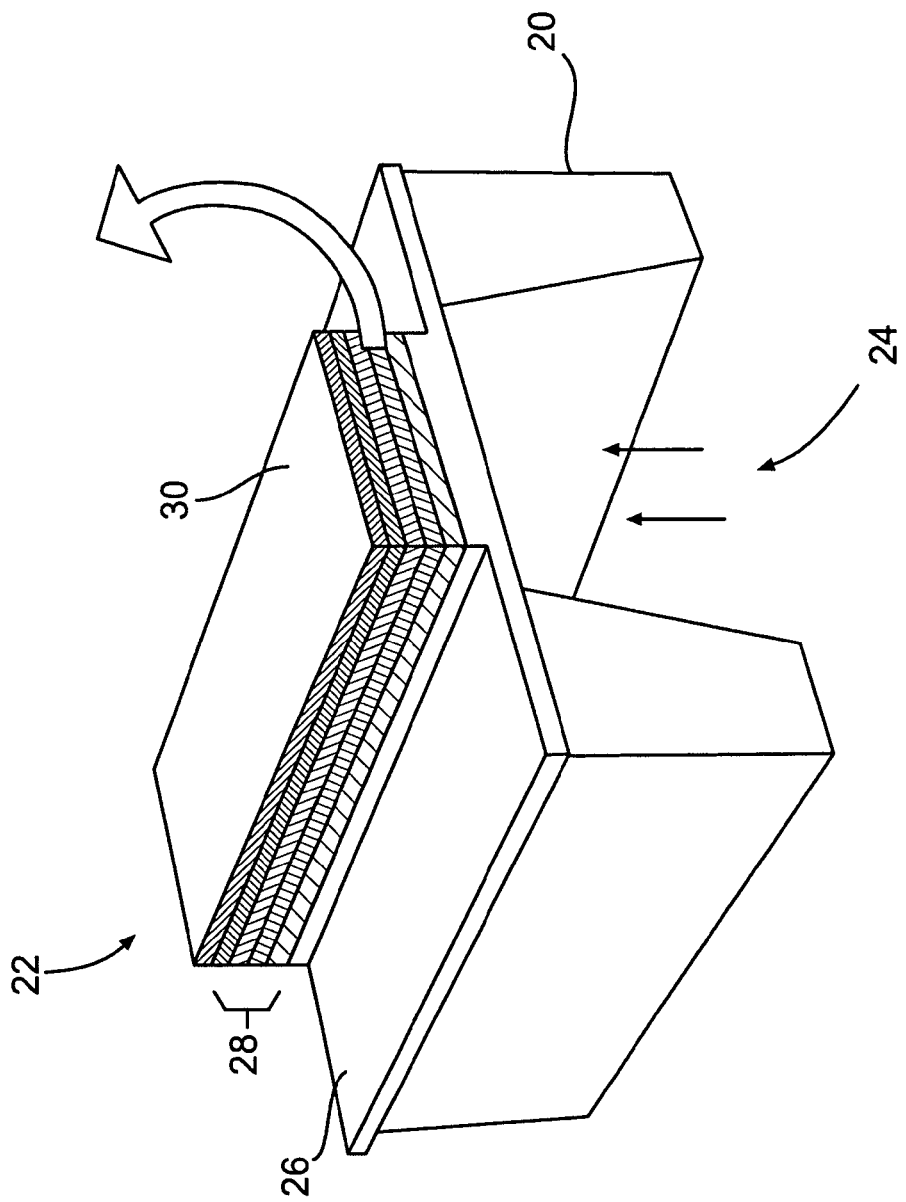

With reference now to FIGS. 2A-2C, shown are illustrations of a novel system and method of fabricating nanocoils utilizing a deep reactive ion etching (DRIE) technique. The DRIE process depicted in these figures allows a large area SOI wafer 20 surface release using a completely dry etching release technique compatible with high reliability/volume standard fabrication processes. SOI wafer 20 may be, e.g., 2000 Å thick (e.g., a Field Ox (oxide) on Silicon Wafer). Furthermore since the dry etching occurs from the underside of the SOI wafer 20, the top stressed nitride will not be exposed to the etchant and will remain fully intact during the coiling arm release.

With reference to FIG. 2A, method includes patterning a coiling arm 22 from the topside of SOI wafer 20, as shown. Coiling arm structure 22 connects to an anchor pad 23. Next, an overlapping etch window mask 24 is patterned on the backside of SOI wafer 20, as shown by the dotted rectangle. The overlapping etch window mask 24 overlaps coiling arm 22 structure. As shown in FIG. 2B, a standard, high selectivity DRIE process is utilized to etch through the backside of SOI wafer 20 and stop on the thin buried oxide layer (BOX) 26. One example of a DRIE process is called the BOSCH™ process, which uses an inductively-coupled plasma (ICP) etch system that cycles back and forth between a plasma-etching process and a teflon-coating process, where the teflon-coating protects the walls, allowing the plasma-etching to bore deeper and deeper as desired. FIG. 2B also illustrates stressed coiling, bi-layer: active silicon device layer(s) 28 and stressed nitride layer 30.

Next, with reference now to FIG. 2C, an RIE process is used to cut the thin oxide membrane (BOX layer 26), thereby releasing coiling arm 22 to coil under the forces of the internally stressed layers (e.g., stressed nitride layer). The RIE process used to cut the oxide membrane may be either a short top or bottom side RIE process (i.e., RIE process may etch into BOX layer 26 along coiling arm 22 from exposed top of BOX layer 26 or may etch away BOX layer 26 underneath coiling arm 22). However, by utilizing a topside RIE, it may be possible to release the coiling arm 22, while leaving all or substantially all the BOX layer 26 intact below active device layer(s) 28. The buried oxide may act as an excellent passivation layer to shield the active device from deleterious effects caused by charging of electron traps at the free surface (anytime there is a free electron surface (i.e., crystal terminates into air), you have electron traps which can affect the performance of nearby devices—the oxide can act as a passivation layer, causing the crystal to terminate into a dielectric and eliminating these traps).

It should be noted that the use of the DRIE etching to remove back or bottom side of SOI wafer 20 to expose BOX layer 26, thereby permitting use of RIE etching to release coiling arm 22, the use of HF acid is avoided. Consequently, the method shown is a "dry etch" fabrication technique. Alternatively, HF acid may be applied, to release coiling arm 22, to exposed BOX layer 26 through bottom side of SOI wafer 20, thereby avoiding exposure of stressed nitride layer 30 and silicon device layer(s) 28 to HF acid.

Figure 3:
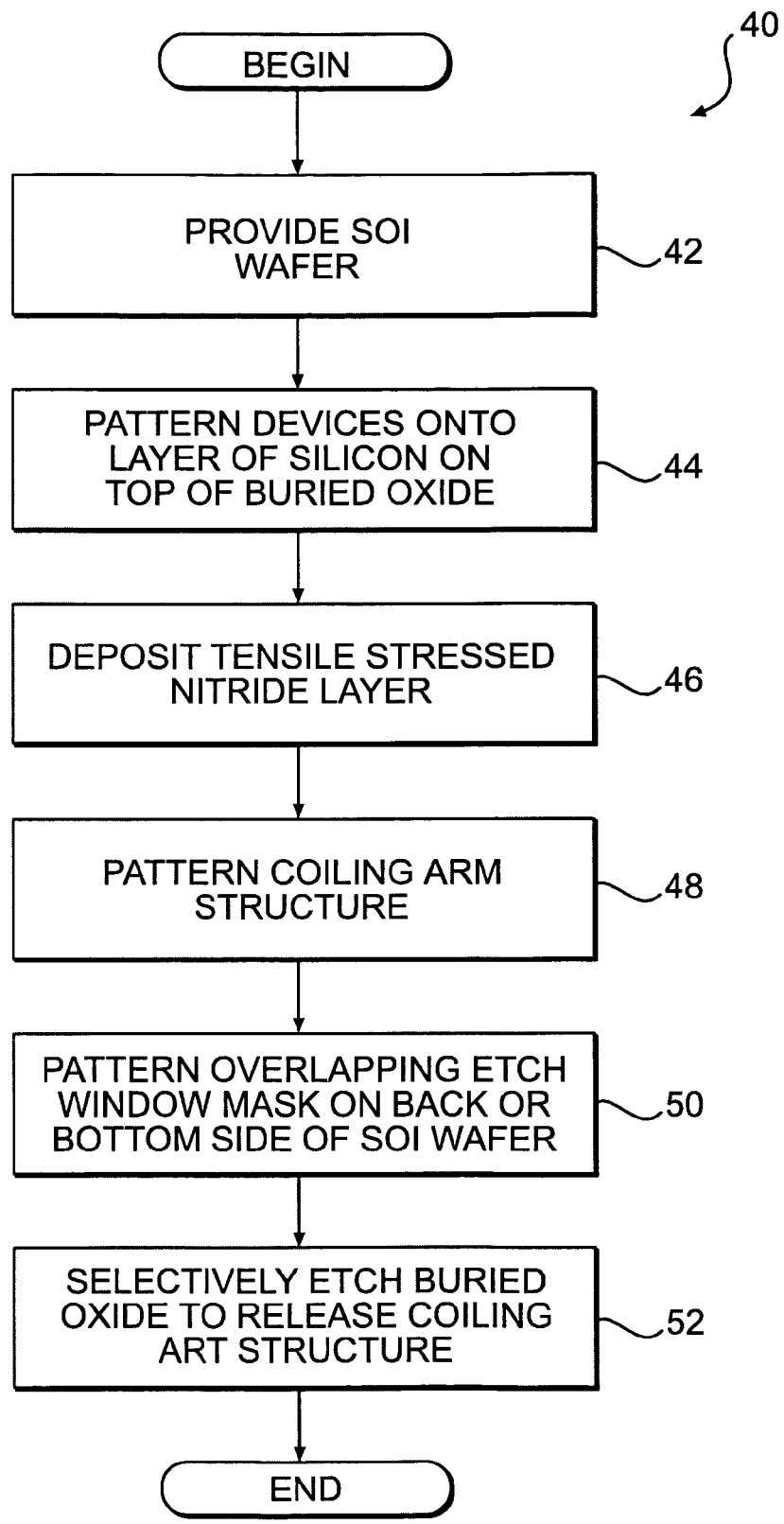
FIG. 3 is a flowchart illustrating an embodiment of a method for fabricating nanocoils utilizing a deep reactive ion etching technique.

With reference now to FIG. 3, illustrated is method 40 for fabricating nanocoils utilizing a DRIE technique. A SOI wafer is provided, block 42. Devices/circuits are patterned onto a layer of silicon on top of the buried oxide using known techniques (e.g., Silicon ASIC fabrication), block 44. The top silicon layer is typically a thin, single crystalline layer. A tensile stressed nitride layer is deposited directly to the top silicon layer, block 46. The coiling arm structure is patterned on top side silicon layer, e.g., by etching or otherwise removing unused portions of top silicon layer and stressed nitride layer overlaying those portions, block 48. An overlapping etch window mask is patterned on back or bottom side of SOI wafer using DRIE etching, block 50. The DRIE etching is stopped when the BOX layer is reached. RIE etching is used to selectively cut the BOX membrane, releasing the coiling arm structure, block 52.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

The invention claimed is:

1. A method for fabricating nanocoils, comprising:
   providing a silicon-on-insulator (SOI) wafer, in which SOI wafer includes buried oxide layer;
   patterning one or more devices onto a silicon device layer on top of the buried oxide layer;
   depositing a tensile stressed layer on the top silicon layer;
   patterning a coiling arm structure on top silicon layer;
   patterning an overlapping etch window mask on bottom side of SOI wafer, in which patterning overlapping etch window mask removes SOI wafer and exposes buried oxide layer in width greater than coiling arm structure; and
   releasing coiling arm structure so that coiling arm coils to form nanocoil.

2. The method of claim 1 in which patterning overlapping etch window comprises deep reactive ion etching (DRIE) SOI wafer bottom side up buried oxide layer.

3. The method of claim 1 in which releasing coiling arm structure comprises reactive ion etching (RIE) portion of buried oxide layer.

4. The method of claim 3 in which RIE etching etches a bottom side of buried oxide layer.

5. The method of claim 3 in which RIE etching etches top side of buried oxide layer.

6. The method of claim 1 in which patterning coiling arm structure comprising etching away portion of top silicon layer.

7. The method of claim 1 in which releasing coiling arm structure forms nanocoil with an intact buried oxide layer.

8. The method of claim 1 in which building a device builds a memory device into top silicon layer.

9. The method of claim 1 in which building a device builds a CMOS device into top silicon layer.

10. The method of claim 1 in which the tensile stressed layer comprises a stressed nitride layer.

11. An improved nanocoil produced using a deep reactive etching technique, comprising:
    a silicon device layer comprising one or more devices patterned on the silicon device layer;
    a nitride layer that provide coiling stress for nanocoil;
    an oxide passivation layer located on bottom-side of silicon device layer; and
    a width greater than that of a nanocoil produced by reactive ion etching and acid dipping techniques.

12. The improved nanocoil of claim 11 in which the silicon device layer comprises a plurality of memory devices.

13. The improved nanocoil of claim 11 in which the silicon device layer comprises integrated control circuitry, integrated memory drivers, memory devices and pins.

14. The improved nanocoil of claim 11 in which the silicon device layer comprises single crystalline silicon.

* * * * *